US011183515B2

(12) United States Patent
Lee et al.

(10) Patent No.: US 11,183,515 B2
(45) Date of Patent: Nov. 23, 2021

(54) DISPLAY DEVICE INCLUDING POLYCRYSTALLINE SILICON LAYER, METHOD OF MANUFACTURING POLYCRYSTALLINE SILICON LAYER, AND METHOD OF MANUFACTURING DISPLAY DEVICE

(71) Applicant: Samsung Display Co., LTD., Yongin-si (KR)

(72) Inventors: Dong-Sung Lee, Hwaseong-si (KR); Jongoh Seo, Seoul (KR); Byung Soo So, Yongin-si (KR); Dong-min Lee, Yongin-si (KR); Yeon Hee Jeon, Hwaseong-si (KR); Jonghoon Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/821,484

(22) Filed: Mar. 17, 2020

(65) Prior Publication Data

US 2020/0303424 A1 Sep. 24, 2020

(30) Foreign Application Priority Data

Mar. 19, 2019 (KR) ........................ 10-2019-0031324

(51) Int. Cl.
*H01L 21/00* (2006.01)
*H01L 27/12* (2006.01)
(Continued)

(52) U.S. Cl.
CPC .... *H01L 27/1222* (2013.01); *H01L 21/02592* (2013.01); *H01L 21/02675* (2013.01);
(Continued)

(58) Field of Classification Search
CPC ........... H01L 27/1222; H01L 21/02592; H01L 21/02675; H01L 27/1274; H01L 29/045; H01L 29/78675
See application file for complete search history.

(56) References Cited

U.S. PATENT DOCUMENTS 8,362,391 B2 1/2013 Partlo et al.
2006/0240647 A1 10/2006 Mitsuhashi et al.
(Continued)

FOREIGN PATENT DOCUMENTS

JP 2003-133560 5/2003
JP 2007-035812 2/2007
(Continued)

OTHER PUBLICATIONS

Hiroyuki Kuriyama et al., "Lateral Grain Growth of Poly-Si Films with a Specific Orientation by an Excimer Laser Annealing Method", Dec. 1993, pp. 6190-6195, vol. 32, Part 1, No. 12B, Jpn. J. Appl. Phys.

(Continued)

*Primary Examiner* — Richard A Booth
(74) *Attorney, Agent, or Firm* — Kile Park Reed & Houtteman PLLC

(57) ABSTRACT

A display device may include a thin film transistor disposed on a substrate, and a display element electrically connected to the thin film transistor. The thin film transistor may include an active pattern including polycrystalline silicon, a gate insulation layer disposed on the active pattern, and a gate electrode disposed on the gate insulation layer. An average value of grain sizes of the active pattern may be in a range of about 400 nm to about 800 nm. An RMS value of a surface roughness of the active pattern may be about 4 nm or less. A method of manufacturing a polycrystalline silicon layer may include cleaning an amorphous silicon layer with hydrofluoric acid, rinsing the amorphous silicon layer with hydrogenated deionized water, and irradiating the amorphous silicon layer with a laser beam having an energy density of about 440 mJ/cm$^2$ to about 490 mJ/cm$^2$.

7 Claims, 14 Drawing Sheets

(51) Int. Cl.
  *H01L 29/786* (2006.01)
  *H01L 21/02* (2006.01)
  *H01L 29/04* (2006.01)
(52) U.S. Cl.
  CPC ........ *H01L 27/1274* (2013.01); *H01L 29/045* (2013.01); *H01L 29/78675* (2013.01)

(56) References Cited

U.S. PATENT DOCUMENTS

| | | | | |
|---|---|---|---|---|
| 2008/0142808 | A1* | 6/2008 | Lee | H01L 27/1214 257/72 |
| 2018/0366682 | A1* | 12/2018 | Kang | H01L 27/3258 |
| 2021/0050052 | A1* | 2/2021 | Okamoto | G11C 11/4091 |
| 2021/0098495 | A1* | 4/2021 | Hu | H01L 27/1259 |

FOREIGN PATENT DOCUMENTS

| | | |
|---|---|---|
| KR | 10-0299292 | 12/2001 |
| KR | 10-0624427 | 9/2006 |
| KR | 10-0874457 | 12/2008 |

OTHER PUBLICATIONS

James S. Im et al., "Phase transformation mechanisms involved in excimer laser crystallization of amorphous silicon films", Oct. 4, 1993, pp. 1969-1971, vol. 63, No. 14, Applied Physics Letters.

\* cited by examiner

DISPLAY DEVICE INCLUDING POLYCRYSTALLINE SILICON LAYER, METHOD OF MANUFACTURING POLYCRYSTALLINE SILICON LAYER, AND METHOD OF MANUFACTURING DISPLAY DEVICE

CROSS-REFERENCE TO RELATED APPLICATION(S)

This application claims priority under 35 USC § 119 to Korean Patent Application No. 10-2019-0031324 filed on Mar. 19, 2019 in the Korean Intellectual Property Office (KIPO), the entire disclosure of which is incorporated by reference herein.

BACKGROUND

1. Field

This disclosure relates to a display device. More particularly, this disclosure relates to a method of manufacturing a polycrystalline silicon layer, a display device including the polycrystalline silicon layer, and a method of manufacturing the display device.

2. Description of the Related Art

An active matrix (AM) type organic light emitting display device may include pixel circuit in each pixel. The pixel circuit may include a silicon-based thin film transistor (TFT). The TFT may be formed of amorphous silicon or polycrystalline silicon. In examples where an active layer of a TFT including a source, a drain, and a channel is formed of amorphous silicon (a-Si), the a-Si TFT used in the pixel circuit may have a low electron mobility, e.g., a mobility of about 1 $cm^2/Vs$ or less. Therefore, a-Si TFTs have been recently replaced with polycrystalline silicon (poly-Si) TFTs, which have higher electron mobility and a safer light illumination than the a-Si TFTs. Accordingly, poly-Si TFTs may be used as an active layer of a driving TFT and/or a switching TFT of the AM type organic light emitting display device.

The poly-Si materials for poly-Si TFTs may be manufactured according to several methods. These methods may be generally classified as either a method of depositing poly-Si or a method of depositing and crystallizing a-Si. Examples of the method of depositing the poly-Si include chemical vapor deposition (CVD), sputtering, vacuum evaporation, etc. Examples of the method of depositing and crystallizing the a-Si include solid phase crystallization (SPC), excimer laser crystallization (ELC), metal induced crystallization (MIC), metal induced lateral crystallization (MILC), sequential lateral solidification (SLS), etc.

SUMMARY

Embodiments provide a display device including a thin film transistor having improved characteristics.

Embodiments provide a method of manufacturing a polycrystalline silicon layer having a large grain size and a small surface roughness.

Embodiments provide a method of manufacturing a display device for improving characteristics of a thin film transistor.

A display device may include a substrate, a thin film transistor disposed on the substrate, and a display element electrically connected to the thin film transistor. The thin film transistor may include an active pattern disposed on the substrate, the active pattern including polycrystalline silicon, an insulation layer disposed on the active pattern, and a gate electrode disposed on the insulation layer. The active pattern may include grains, and an average size of the grains may be in a range of about 400 nm to about 800 nm.

The active pattern may include a surface on which a protrusion may be formed between adjacent ones of the grains, and a thickness of the protrusion may be about 4 nm or less. The thickness of the protrusion may correspond to a distance between a top of the protrusion and a surface of the active pattern in a grain adjacent to the protrusion. The active pattern may include a rough surface of which roughness has a root-mean-square value equal to or less than about 4 nm. The active pattern may include grain boundaries each of which may be formed between adjacent ones of the grains, and a size of a grain may correspond to a distance between adjacent grain boundaries of the grain.

Each grain may include one or more crystal planes, and a ratio of a (111) direction crystal plane to total crystal planes of the active pattern may be greater than a ratio of a (001) direction crystal plane to the total crystal planes.

A value obtained by dividing a sum of a ratio of a (001) direction crystal plane to total crystal planes of the active pattern and a ratio of a (101) direction crystal plane to the total crystal planes by a ratio of a (111) direction crystal plane to the total crystal planes may be about 0.7 or less.

The active pattern may include a source region, a drain region, and a channel region formed between the source region and the drain region.

The gate electrode may overlap the channel region of the active pattern.

The thin film transistor may further include a source electrode and a drain electrode disposed on the gate electrode, and the source electrode and the drain electrode may be respectively electrically connected to the source region and the drain region of the active pattern.

The display element may include a first electrode electrically connected to the thin film transistor, an emission layer disposed on the first electrode, and a second electrode disposed on the emission layer.

A method of manufacturing a polycrystalline silicon layer may include forming an amorphous silicon layer on a substrate, cleaning the amorphous silicon layer with hydrofluoric acid, rinsing the amorphous silicon layer with hydrogenated deionized water, and irradiating the amorphous silicon layer with a laser beam having an energy density in a range of about 440 $mJ/cm^2$ to about 490 $mJ/cm^2$ to form the polycrystalline silicon layer.

A thickness of the amorphous silicon layer may be in a range of about 370 Å to about 500 Å.

The hydrofluoric acid may include a hydrogen fluoride in an amount of about 0.5%.

The cleaning the amorphous silicon layer may be performed for a time period of about 60 seconds to about 120 seconds.

A hydrogen concentration of the hydrogenated deionized water may be about 1.0 ppm.

A wavelength of the laser beam may be about 308 nm.

A scan pitch of the laser beam may be about 10 µm or less.

The forming the polycrystalline silicon layer may include forming grains on a surface of the polycrystalline silicon layer, and an average size of the grains of the polycrystalline silicon layer may be in a range of about 400 nm to about 800 nm.

The forming the polycrystalline silicon layer may include forming a rough surface of the polycrystalline silicon layer, and a root-mean-square (RMS) value of a roughness of the rough surface of the polycrystalline silicon layer may be about 4 nm or less.

A method of manufacturing a display device may include forming an amorphous silicon layer on a substrate, cleaning the amorphous silicon layer with hydrofluoric acid, rinsing the amorphous silicon layer with hydrogenated deionized water, irradiating the amorphous silicon layer with a laser beam having an energy density of about 440 mJ/cm$^2$ to about 490 mJ/cm$^2$ to form a polycrystalline silicon layer, etching the polycrystalline silicon layer to form a polycrystalline silicon pattern, forming a gate insulation layer on the polycrystalline silicon pattern, forming a gate electrode on the gate insulation layer, injecting ions at a portion of the polycrystalline silicon pattern to form an active pattern, and forming a display element on the gate electrode.

The forming the display element may include forming a first electrode on the gate electrode, the first electrode being electrically connected to the active pattern, forming an emission layer on the first electrode, and forming a second electrode on the emission layer.

In the display device, the active pattern of the thin film transistor which includes the polycrystalline silicon may have a relatively large grain size and a relatively small surface roughness. Therefore, characteristics such as electric charge mobility, hysteresis, etc. of the thin film transistor may be improved.

In the method of manufacturing the polycrystalline silicon layer, before crystallizing the amorphous silicon layer to form the polycrystalline silicon layer, the amorphous silicon layer may be cleaned and rinsed, and the amorphous silicon layer may be irradiated with a laser beam having a relatively large energy density. Therefore, the polycrystalline silicon layer having a relatively large grain size and a relatively small surface roughness may be formed.

In the method of manufacturing the display device, before crystallizing the amorphous silicon layer to form the active pattern including polycrystalline silicon, the amorphous silicon layer may be cleaned and rinsed, and the amorphous silicon layer may be irradiated with the laser beam having a relatively large energy density. Therefore, characteristics such as electric charge mobility, hysteresis, etc. of the thin film transistor may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
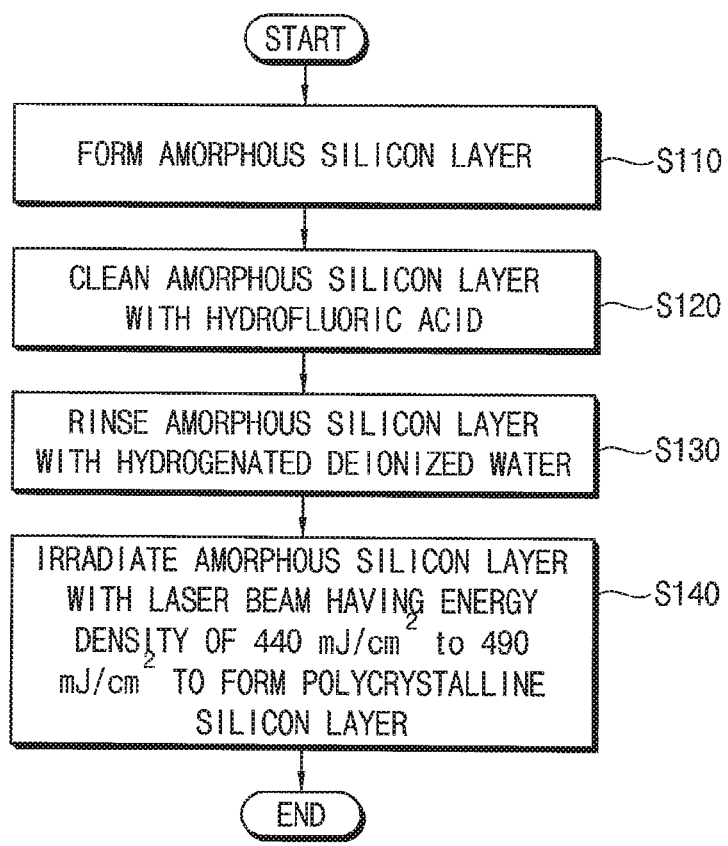
FIG. 1 is a flowchart illustrating a method of manufacturing a polycrystalline silicon layer according to an embodiment.

Hereinafter, examples of methods of manufacturing polycrystalline silicon layers, thin film transistor substrates and methods of manufacturing the thin film transistor substrates, and display devices and methods of manufacturing the display devices will be explained in detail with reference to the accompanying drawings.

Specific examples are illustrated in the drawings and described in detail in the specification. However, the disclosed systems and devices can be modified in various manners and take various forms different from the detailed drawings but consistent with this disclosure. Thus, it should be understood that this disclosure is not intended to be limited to the disclosed particular forms. Further, it should be understood that the disclosure is intended to cover all modifications, equivalents, and substitutions within the spirit and technical range of the disclosure. It should further be understood that in the this application, the terms "include", "have", or the like are used to specify that there is a feature, a number, a step, an operation, an element, a part, or a combination thereof described in the specification, but do not exclude a possibility of the presence or addition of one or more other features, numbers, steps, operations, elements, parts, or combinations thereof in advance.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

Still further, the spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, further to the orientation depicted in the drawings. In varying examples, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It is further to be understood that, although the terms "first," "second," "third," or the like may be used herein to describe various elements, such elements should not be limited by these terms. These terms are used to distinguish one element from another element or for the convenience of description and explanation thereof. In varying examples, when "a first element" is discussed in the description, it may be termed "a second element" or "a third element," and "a second element" and "a third element" may be termed in a similar manner without departing from the teachings herein. In varying examples, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

Further, the terms "about" or "approximately" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). In varying examples, "about" may mean within one or more standard deviations, or within ±5%, 10%, 20%, 30%, or 80% of a stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification. Further, the phrase "in a plan view" refers to when an object portion is viewed from above, and the phrase "in a cross-sectional view" refers to when a cross-section taken by vertically cutting an object portion is viewed from the side.

It is to be appreciated to those skilled in the art in light of this disclosure that, while the various processes/operations of various methods discussed below may be shown according to one or more particular orders for ease of explanation, that certain processes/operations may be performed in different orders or performed in a parallel fashion in varying method examples. It is to be further appreciated that certain processes/operations may be omitted in various examples of disclosed methods. Accordingly, a particular order of processes/operations should be determined by the language of the claims rather than inferred by the specification.

Turning to the drawings, FIG. 1 is a flowchart to explain an embodiment of a method of manufacturing a polycrystalline silicon layer. FIGS. 2, 3, 4, and 5 are schematic diagrams to explain an embodiment of a method of manufacturing a polycrystalline silicon layer.

Figure 2:
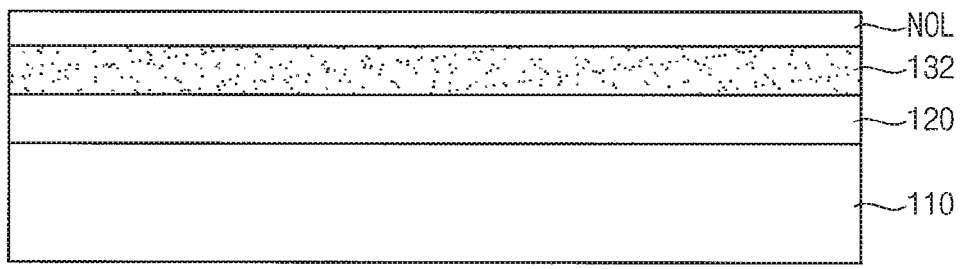
FIGS. 2, 3, 4, and 5 are schematic diagrams to explain a method of manufacturing a polycrystalline silicon layer according to an embodiment.

Referring to FIGS. 1 and 2, an amorphous silicon layer 132 may be formed on a substrate 110 (S110). The substrate 110 may be an insulating substrate including glass, quartz, ceramic, etc. The substrate 110 may be an insulating flexible substrate including plastic such as polyethylene terephthalate (PET), polyethylene naphthalate (PEN), polyether ether ketone (PEEK), polycarbonate (PC), polyarylate, polyether sulfone (PES), polyimide (PI), etc.

A buffer layer 120 may be formed on the substrate 110. The buffer layer 120 may provide a planar or planarized surface above the substrate 110. The buffer layer 120 may prevent impurities from permeating through the substrate 110. For example, the buffer layer 120 may be formed of silicon oxide, silicon nitride, etc., or a combination thereof.

The amorphous silicon layer 132 may be formed on the buffer layer 120. The amorphous silicon layer 132 may be formed by methods such as low pressure chemical vapor deposition (LPCVD), atmospheric pressure chemical vapor deposition (APCVD), plasma enhanced chemical vapor deposition (PECVD), sputtering, vacuum evaporation, etc., or a combination thereof.

A thickness of the amorphous silicon layer 132 may be in a range of about 370 Å to about 500 Å. If the thickness of the amorphous silicon layer 132 is less than about 370 Å, the hysteresis characteristic of a thin film transistor including a polycrystalline silicon layer that is formed by crystallizing the amorphous silicon layer 132 may decrease.

A natural oxide layer NOL may be formed on the amorphous silicon layer 132. The natural oxide layer NOL may be formed when an upper portion of the amorphous silicon layer 132 is exposed to air. When the natural oxide layer NOL remains on the amorphous silicon layer 132, a protrusion that has a relatively large thickness may be formed on a surface of the polycrystalline silicon layer by the natural oxide layer NOL in a subsequent process for crystallizing the amorphous silicon layer 132 to form the polycrystalline silicon layer.

Figure 3:
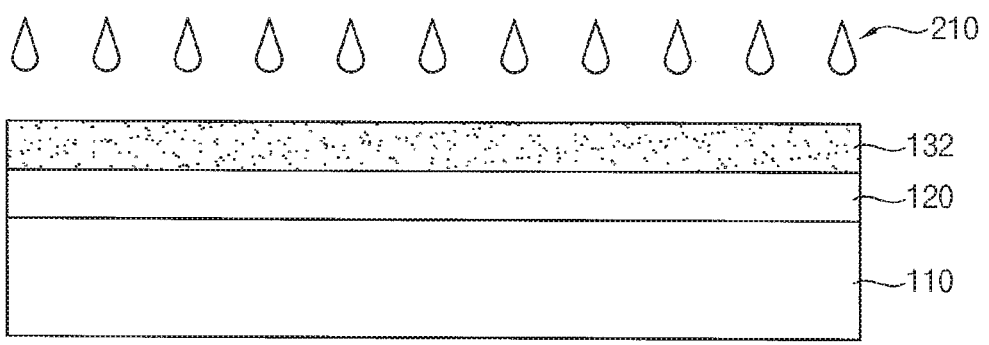

Referring to FIGS. 1 and 3, the amorphous silicon layer 132 may be cleaned (S120).

The amorphous silicon layer 132 may be cleaned, for example, using hydrofluoric acid 210. The hydrofluoric acid 210 may be an aqueous solution in which a hydrogen fluoride (HF) dissolves. For instance, the hydrofluoric acid 210 may include the hydrogen fluoride in an amount of about 0.5%. The amorphous silicon layer 132 may be cleaned by the hydrofluoric acid 210 to remove the natural oxide layer NOL formed on the amorphous silicon layer 132.

The amorphous silicon layer 132 may be cleaned for about 60 seconds to about 120 seconds. If the amorphous silicon layer 132 is cleaned for less than about 60 seconds, the natural oxide layer NOL formed on the amorphous silicon layer 132 may not be sufficiently or appropriately removed, and grains of the subsequently formed polycrystalline silicon layer may not grow enough. If the amorphous silicon layer 132 is cleaned for greater than about 120 seconds, the amorphous silicon layer 132 may be affected by the hydrofluoric acid 210, and grains of the subsequently formed polycrystalline silicon layer may burst.

Figure 4:
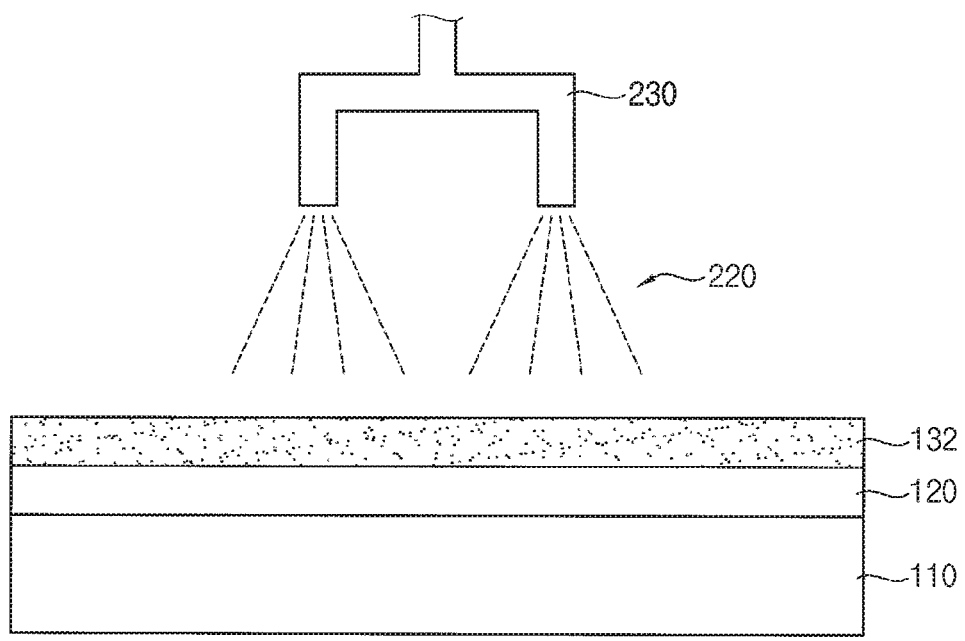

Referring to FIGS. 1 and 4, the amorphous silicon layer 132 may be rinsed (S130). The amorphous silicon layer 132 may be rinsed, for example, using hydrogenated deionized water 220. A hydrogen concentration of the hydrogenated deionized water 220 may be about 1.0 ppm. The hydrogenated deionized water 220 may be supplied to the amorphous silicon layer 132 via a spray 230. In an embodiment, the substrate 110 disposed under the spray 230 may move, and the spray 230 may be fixed. The hydrofluoric acid 210 that remains on the amorphous silicon layer 132 may be removed by rinsing the amorphous silicon layer 132 with the hydrogenated deionized water 220.

If the amorphous silicon layer 132 is rinsed with dehydrogenated deionized water, oxygen in the deionized water may remain on the amorphous silicon layer 132, which may cause or result in a visible circular defect due to the oxygen after a crystallization process. However, in this and other possible examples, the amorphous silicon layer 132 may be rinsed with the hydrogenated deionized water 220 thereby preventing such circular defect.

Figure 5:
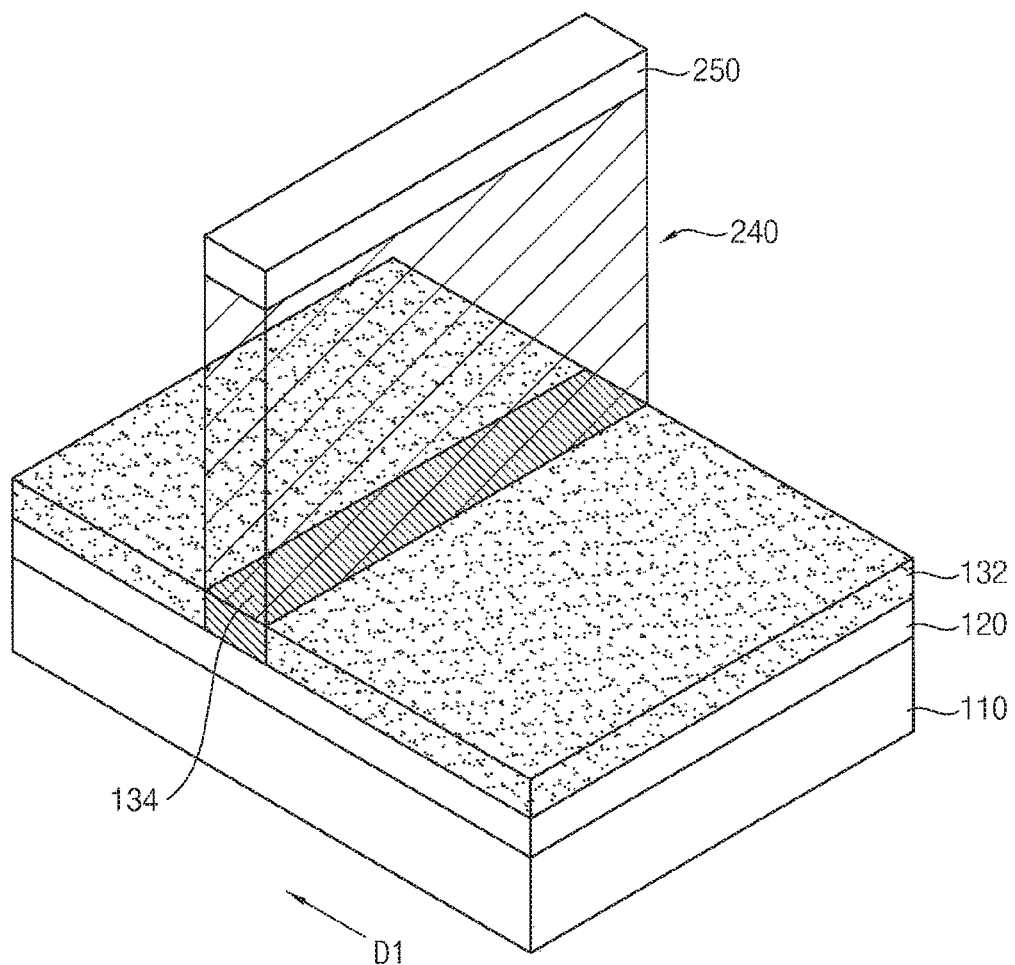

Referring to FIGS. 1 and 5, a polycrystalline silicon layer 134 may be formed (S140). The polycrystalline silicon layer 134 may be formed by irradiating the amorphous silicon layer 132 with a laser beam 240. A laser 250 may generate the laser beam 240 to irradiate the amorphous silicon layer 132. The laser 250 may generate the laser beam 240 intermittently. The laser 250 may be an excimer laser for generating the laser beam 240 which may have a relatively short wavelength, relatively high power, and/or relatively high efficiency. The excimer laser may include, for example, an inert gas, an inert gas halide, a mercury halide, an inert gas acid compound, a polyatomic excimer, or a combination thereof. Examples of the inert gas are $Ar_2$, $Kr_2$, and $Xe_2$. Examples of the inert gas halide are ArF, ArCl, KrF, KrCl, XeF, and XeCl. Examples of the mercury halide are HgCl, HgBr, and HgI. Examples of the inert gas acid compound are ArO, KrO, and XeO. Examples of the polyatomic excimer are $Kr_2F$, and $Xe_2F$.

The amorphous silicon layer 132 may be crystallized into the polycrystalline silicon layer 134 by irradiating the amorphous silicon layer 132 with the laser beam 240 emitted from the laser 250. The substrate 110 may move along direction D1 as shown in FIG. 5. In other embodiments, a laser may move along a substrate to irradiate a laser beam on an amorphous silicon layer disposed on the substrate. A wavelength of the laser beam 240 irradiated to the amorphous silicon layer 132 may be about 308 nm.

The laser 250 may irradiate the amorphous silicon layer 132 with the laser beam 240 having an energy density in a range of about 440 $mJ/cm^2$ to about 490 $mJ/cm^2$. If the energy density of the laser beam 240 is less than about 440 $mJ/cm^2$, a grain size of the polycrystalline silicon layer 134 may be relatively small. If the energy density of the laser beam 240 is greater than about 490 $mJ/cm^2$, the amorphous silicon layer 132 may be completely liquidated by the laser beam 240 so that crystal seeds for crystallization of silicon may not be formed.

A scan pitch of the laser beam 240 may be about 10 μm or less. When the scan pitch of the laser beam 240 is about 10 μm or less, the polycrystalline silicon layer 134 having a relatively large grain size may be formed. As shown in FIG. 5, a region in which the crystallization process is performed using the laser beam 240 may be converted into polycrystalline silicon from amorphous silicon so that the polycrystalline silicon layer 134 may be formed from the amorphous silicon layer 132.

Figure 6:
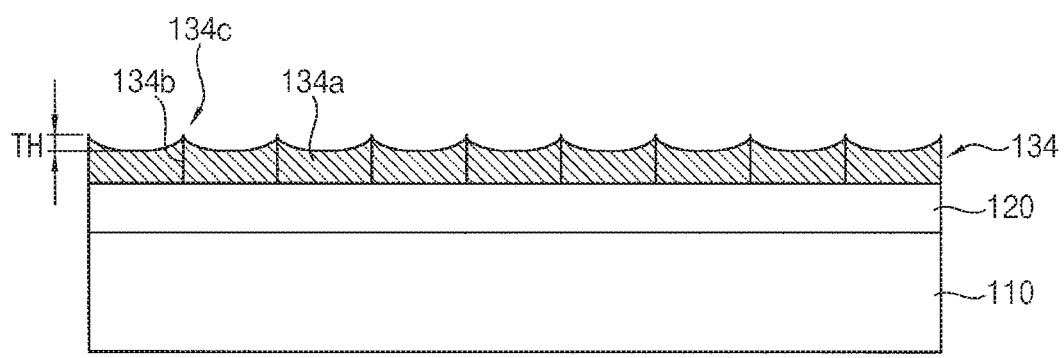
FIGS. 6 and 7 are schematic diagrams to explain a polycrystalline silicon layer according to an embodiment.
Figure 7:
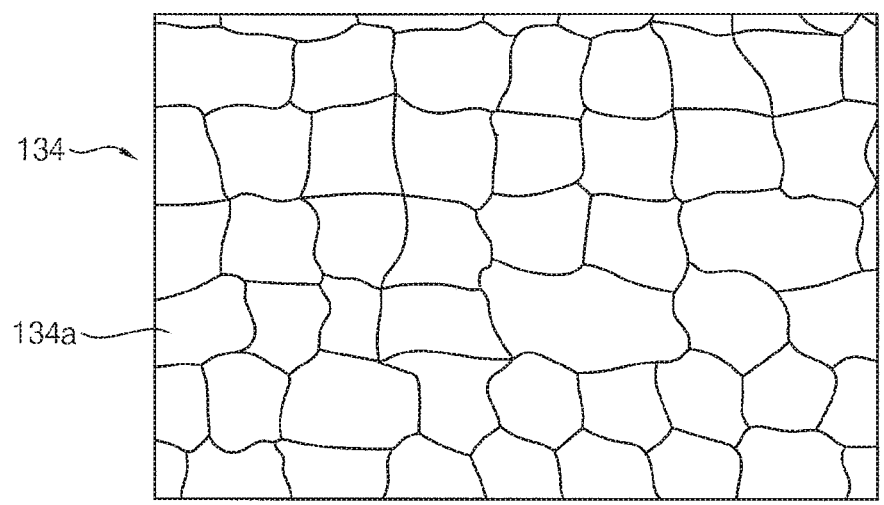

FIGS. 6 and 7 are schematic diagrams illustrating a polycrystalline silicon layer according to an embodiment. The polycrystalline silicon layer 134 shown in FIGS. 6 and 7 may be formed by the manufacturing method, for example, described with reference to FIGS. 1 to 5.

Referring to FIGS. 5, 6, and 7, one or more grains 134a may be formed in the polycrystalline silicon layer 134. When the laser beam 240 is irradiated on the amorphous silicon layer 132 in a solid state, the amorphous silicon layer 132 may absorb heat and change to be in a liquid state. The amorphous silicon layer 132 may release the heat and change to be in the solid state again. Through and by the irradiation of the laser beam 240, crystal may grow from a crystal seed to form a grain 134a. In instances where there is a difference in cooling rate in the amorphous silicon layer 132 in the course of changing from the liquid state to the solid state, since the grain 134a grows from a region having a relatively higher cooling rate toward a region having a relatively slower cooling rate, a grain boundary 134b may be formed in the region having the relatively slower cooling rate.

When the amorphous silicon layer 132 is irradiated with the laser beam 240 having the wavelength of about 308 nm and the energy density of about 440 $mJ/cm^2$ to about 490 $mJ/cm^2$ with the scan pitch of about 10 μm or less as described above, an average value of the grain sizes may be in a range of about 400 nm to about 800 nm. Here, a grain size of a grain 134a may mean a width of the grain 134a in a plan view. The grain size may be a distance between adjacent grain boundaries 134b. The sizes of the grains 134a of the polycrystalline silicon layer 134 may be determined by a wavelength, a scan pitch, an energy density, etc., or a combination thereof of the laser beam 240 irradiated from the laser 250. For example, the larger the wavelength of the laser beam 240, the smaller the scan pitch of the laser beam 240, and the larger the energy density of the laser beam 240, the larger the sizes of the grains 134a of the polycrystalline silicon layer 134.

In a conventional method of manufacturing a polycrystalline silicon layer, an amorphous silicon layer may be irradiated with a laser beam having a wavelength of about 308 nm and a relatively small energy density (e.g., about 410 $mJ/cm^2$ to about 440 $mJ/cm^2$) with a relatively large scan pitch (e.g., about 15 μm to about 25 μm), and a polycrystalline silicon layer having a relatively small grain size (e.g., an average value of the grain sizes is less than about 300 nm) may be formed. However, in this and other possible embodiments of the invention, the amorphous silicon layer 132 may be irradiated with the laser beam 240 having a wavelength of about 308 nm and a relatively large energy density (e.g., about 440 $mJ/cm^2$ to about 490 $mJ/cm^2$) with a relatively small scan pitch (e.g., about 10 μm or less), and the polycrystalline silicon layer 134 having a relatively large grain size (e.g., an average value of grain sizes is in a range of about 400 nm to about 800 nm) may be formed. Each grain 134a of the polycrystalline silicon layer 134 may include one or more crystal planes. The crystal planes of each grain 134a may include crystal planes with different directions.

A ratio of a (111) direction crystal plane to total crystal planes of the polycrystalline silicon layer 134 may be greater than a ratio of a (001) direction crystal plane to the total crystal planes of the polycrystalline silicon layer 134. In a conventional method of manufacturing a polycrystalline silicon layer such that an amorphous silicon layer is irradiated with a laser beam having a relatively small energy density (e.g., about 410 $mJ/cm^2$ to about 440 $mJ/cm^2$), a ratio of a (111) direction crystal plane to total crystal planes may be less than a ratio of a (001) direction crystal plane to the total crystal planes. However, in the method of manufacturing the polycrystalline silicon layer according to this and other possible embodiments, when the amorphous silicon layer 132 is irradiated with the laser beam 240 having a relatively large energy density (e.g., about 440 $mJ/cm^2$ to about 490 $mJ/cm^2$), a ratio of a (111) direction crystal plane to total crystal planes may be greater than a ratio of a (001) direction crystal plane to the total crystal planes. A value obtained by dividing a sum of a ratio of a (001) direction crystal plane to the total crystal planes and a ratio of a (101) direction crystal plane to the total crystal planes by a ratio of a (111) direction crystal plane to the total crystal planes may be about 0.7 or less. Here, "(111), (001), and (101)" represent direction indices or Miller indices.

A protrusion 134c may be formed at a grain boundary 134b on a surface of the polycrystalline silicon layer 134 which is formed through the above-described crystallization process. The amorphous silicon layer 132 melted by the laser beam 240 may be re-crystallized to form the grains 134a of the polycrystalline silicon layer 134. The protrusions 134c may be formed at the grain boundaries 134b.

Sizes of the grains 134a and a number of the protrusions 134c formed at the grain boundaries 134b may be inversely proportional. For example, the larger the sizes of the grains 134a, the smaller the number of the protrusions 134c. As the sizes of the grains 134a of the polycrystalline silicon layer 134 may be relatively larger, the number of the protrusions 134c included in a unit area may be relatively smaller.

The protrusions 134c may project upward from the surface of the polycrystalline silicon layer 134, and may have a sharp-pointed tip. The protrusions 134c may each have a thickness TH corresponding to a distance from the surface of the polycrystalline silicon layer 134 to the tip of each protrusion 134c. For example, the thickness TH of each protrusion may be a distance between the top of a sharp-pointed tip of the protrusion and a lowest level of the surface of the polycrystalline silicon layer 134 in a grain adjacent to the protrusion. In each grain, the lowest level of the surface of the polycrystalline silicon layer 134 may correspond to a surface level at or around a center of a grain.

The surface of the polycrystalline silicon layer 134 may be rough. A root-mean-square (RMS) value of a surface roughness of the polycrystalline silicon layer 134 may be about 4 nm or less. An RMS value of the thicknesses of the protrusions 134c formed on the surface of the polycrystalline silicon layer 134 may be about 4 nm or less.

The cleaning process (S120) using the hydrofluoric acid 210 and the rinsing process (S130) using the hydrogenated deionized water 220 may be performed before the crystallization process (S140). The crystallization process (S140) may be performed irradiating the amorphous silicon layer 132 with the laser beam having a relatively large energy density with a relatively small scan pitch. Therefore, the polycrystalline silicon layer 134 having a relatively large grain size and a relatively small surface roughness may be formed.

Hereinbefore, the cleaning process (S120), the rinsing process (S130), and the crystallization process (S140) for forming the polycrystalline silicon layer 134 are described. However, it is possible to add processes and/or operations for forming the polycrystalline silicon layer 134 in addition to the above processes and/or operations, or omit some of the above processes and/or operations. It is further possible that different processes and/or operations may be performed at different times or at a same time period, or that a same process and/or operation be performed at different or multiple times. For instance, in varying examples, the crystallizing process (S140) may be performed two or more times.

Figure 8:
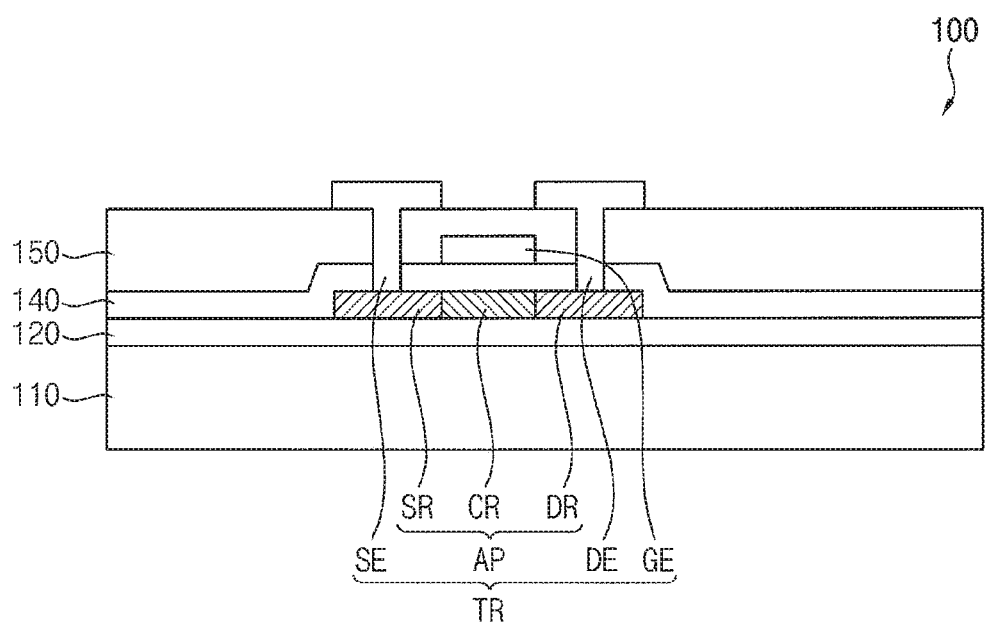
FIG. 8 is a schematic cross-sectional view illustrating a thin film transistor substrate according to an embodiment.

Hereinafter, a thin film transistor substrate and a method of manufacturing the thin film transistor substrate will be described with reference to FIGS. 8 to 15. FIG. 8 is a schematic cross-sectional view illustrating a thin film transistor substrate according to an embodiment.

Referring to FIG. 8, a thin film transistor substrate 100 may include a substrate 110 and a thin film transistor TR disposed on the substrate 110. The thin film transistor TR may include an active pattern AP, a gate insulation layer 140, a gate electrode GE, a source electrode SE, and a drain electrode DE which are sequentially stacked. The thin film transistor TR may perform a switching operation of flowing a current through the active pattern AP based on a signal applied to the gate electrode GE. The thin film transistor TR may have a top gate structure in which the gate electrode GE is positioned above the active pattern AP. However, this and other particular examples are not limited thereto, and the thin film transistor TR may have a bottom gate structure in which the gate electrode is positioned below the active pattern AP.

Figure 9:
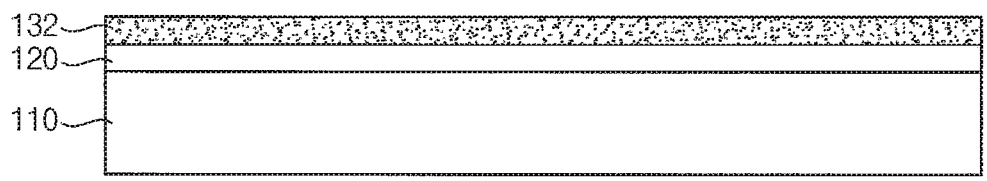
FIGS. 9, 10, 11, 12, 13, 14, and 15 are schematic cross-sectional views to explain a method of manufacturing a thin film transistor substrate according to an embodiment.

FIGS. 9, 10, 11, 12, 13, 14, and 15 are schematic cross-sectional views to explain a method of manufacturing a thin film transistor substrate, for example, the thin film transistor substrate in FIG. 8. In the below description of a method of manufacturing a thin film transistor substrate, it will be avoided to repeat the same or similar description provided above for the method of manufacturing the polycrystalline silicon layer. Referring to FIG. 9, an amorphous silicon layer 132 may be formed on a substrate 110.

The substrate 110 may be an insulating substrate including glass, quartz, ceramic, etc., or a combination thereof. The substrate 110 may be an insulating flexible substrate including plastic such as PET, PEN, PEEK, PC, polyarylate, PES, PI, etc., or a combination thereof. A barrier layer that includes silicon oxide, silicon nitride, amorphous silicon, etc., or a combination thereof may be additionally formed on the substrate 110.

A buffer layer 120 may be formed on the substrate 110. The buffer layer 120 may provide a planar or planarized surface above the substrate 110. The buffer layer 120 may prevent impurities from permeating through the substrate 110.

The amorphous silicon layer 132 may be formed on the buffer layer 120. The amorphous silicon layer 132 may be formed by methods such as LPCVD, APCVD, PECVD, sputtering, vacuum evaporation, etc. or a combination thereof. A natural oxide layer may be formed on the amorphous silicon layer 132.

The amorphous silicon layer 132 may be cleaned using hydrofluoric acid. The hydrofluoric acid may include a hydrogen fluoride in an amount of about 0.5%. The amorphous silicon layer 132 may be cleaned by the hydrofluoric acid to remove the natural oxide layer formed on the amorphous silicon layer 132. The amorphous silicon layer 132 may be cleaned for about 60 seconds to about 120 seconds. The amorphous silicon layer 132 may be rinsed using hydrogenated deionized water. A hydrogen concentration of the hydrogenated deionized water may be about 1.0 ppm. The hydrofluoric acid that remains on the amorphous silicon layer 132 may be removed by rinsing the amorphous silicon layer 132 with the hydrogenated deionized water.

Figure 10:
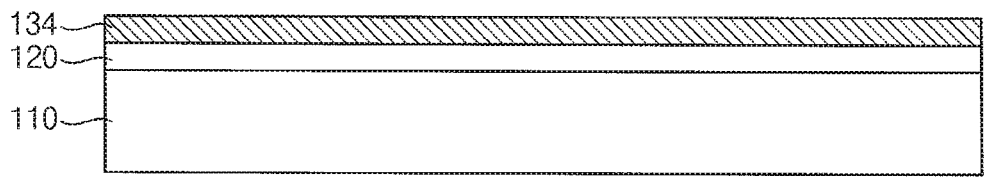

Referring to FIG. 10, the amorphous silicon layer 132 may be crystallized to form a polycrystalline silicon layer 134. The polycrystalline silicon layer 134 may be formed by irradiating the amorphous silicon layer 132 with a laser beam. A laser may generate the laser beam to irradiate the amorphous silicon layer 132. The laser may intermittently generate the laser beam. The laser may irradiate the amorphous silicon layer 132 with the laser beam having an energy density in a range of about 440 mJ/cm$^2$ to about 490 mJ/cm$^2$. A wavelength of the laser beam may be about 308 nm. A scan pitch of the laser beam may be about 10 μm or less.

When the laser beam is irradiated on the amorphous silicon layer 132 in a solid state, the amorphous silicon layer 132 may absorb heat and change to be in a liquid state. The amorphous silicon layer 132 may release the heat and change to be in the solid state again. Through and by the irradiation of the laser beam 240, crystal may grow from a crystal seed to form a grain. In instances where there is a difference in cooling rate in the amorphous silicon layer 132 in the course of changing from the liquid state to the solid state, since the grain grows from a region having a relatively higher cooling rate toward a region having a relatively slower cooling rate, a grain boundary may be formed in the region having the relatively slower cooling rate.

One or more grains may be formed in the polycrystalline silicon layer 134. An average value of grain sizes may in a range of about 400 nm to about 800 nm. A protrusion may be formed at a grain boundary on a surface of the polycrystalline silicon layer 134 which is formed through the crystallization process. The protrusion may project upward from the surface of the polycrystalline silicon layer 134, and may have a sharp-pointed tip. The protrusion may have a thickness corresponding to a distance from the surface of the polycrystalline silicon layer 134 to the tip of the protrusion. An RMS value of a surface roughness of the polycrystalline silicon layer 134 may be about 4 nm or less. An RMS value of the thicknesses of the protrusions formed on the surface of the polycrystalline silicon layer 134 may be about 4 nm or less.

Figure 11:
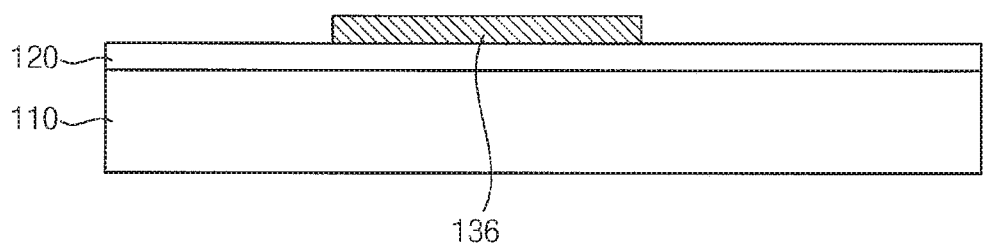

Referring to FIG. 11, the polycrystalline silicon layer 134 may be etched to form a polycrystalline silicon pattern 136. The polycrystalline silicon layer 134 may be etched by photolithography. A photoresist pattern may be formed on the polycrystalline silicon layer 134 using an exposing process and a developing process, and the polycrystalline silicon layer 134 may be etched using the photoresist pattern as an etch-stopper.

Figure 12:
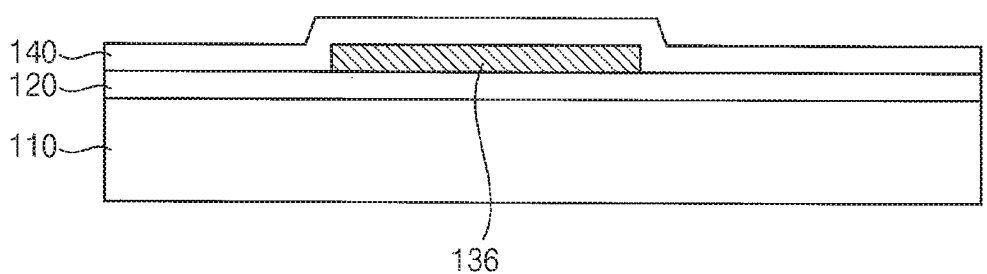

Referring to FIG. 12, a gate insulation layer 140 may be formed on the polycrystalline silicon pattern 136. The gate insulation layer 140 may be disposed on the buffer layer 120, and may cover the polycrystalline silicon pattern 136. The gate insulation layer 140 may be formed of silicon oxide, silicon nitride, etc. or a combination thereof.

The polycrystalline silicon pattern 136 in which an RMS value of a surface roughness is about 4 nm or less may be formed so that the polycrystalline silicon pattern 136 may have a relatively small surface roughness. Accordingly, an effect to the gate insulation layer 140 formed on the polycrystalline silicon pattern 136 by the protrusions formed on the surface of the polycrystalline silicon pattern 136 may be minimized, and the gate insulation layer 140 may be relatively thin. A thickness of the gate insulation layer 140 may be in a range of about 30 nm to about 200 nm.

Figure 13:
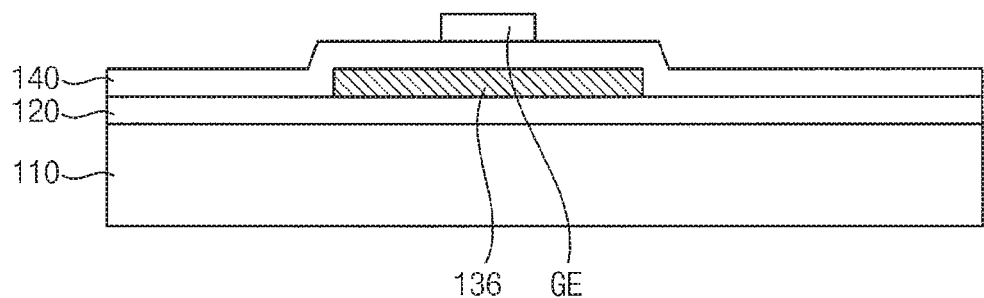

Referring to FIG. 13, the gate electrode GE may be formed on the gate insulation layer 140. The gate electrode GE may overlap the polycrystalline silicon pattern 136. The gate electrode GE may include gold (Au), silver (Ag), aluminum (Al), copper (Cu), nickel (Ni), platinum (Pt), magnesium (Mg), chromium (Cr), tungsten (W), molybdenum (Mo), titanium (Ti), or an alloy thereof. and the gate electrode GE may have a single-layer structure or a multi-layer structure including different metal layers. For example, the gate electrode GE may include a triple layer of Mo, Al and Mo, a double layer of Cu and Ti, or the like. A first metal layer and a photoresist pattern that overlaps the polycrystalline silicon pattern 136 may be formed on the gate insulation layer 140. The first metal layer may be etched using the photoresist pattern to form the gate electrode GE.

Figure 14:
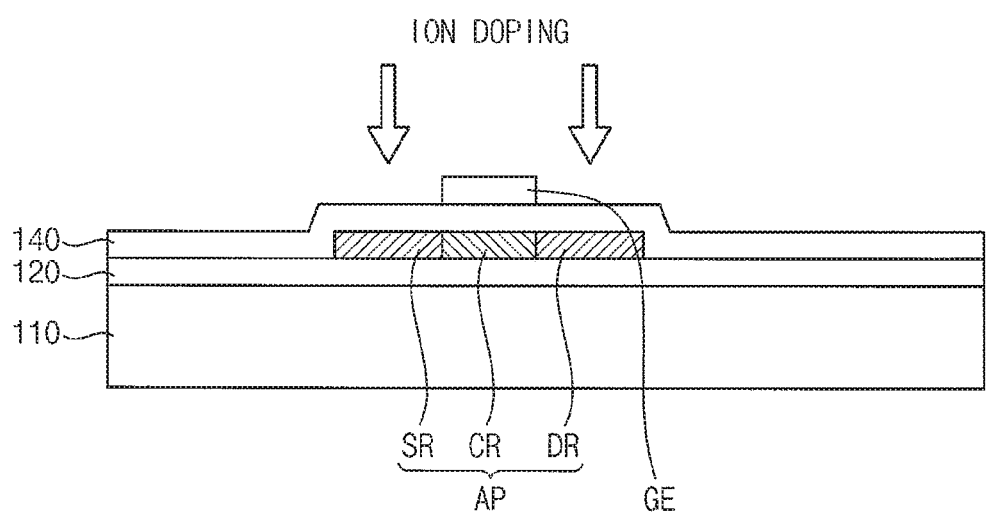

Referring to FIG. 14, ions may be injected into portions of the polycrystalline silicon pattern 136 to form an active pattern AP. The polycrystalline silicon pattern 136 may be partially doped with an ion injection process so that the active pattern AP including a source region SR, a channel region CR, and a drain region DR may be formed. The ions may be n-type impurities or p-type impurities. The ions may not be doped and remain in a portion of the polycrystalline silicon pattern 136 which overlaps the gate electrode GE thereby forming the channel region CR. Portions of the polycrystalline silicon pattern 136 which are doped with ions may have increased conductivity and may have a property of conductor, so that the source region SR and the drain region DR may be formed. The channel region CR may be formed between the source region SR and the drain region DR. A low concentration doping region may be respectively formed between the channel region CR and the source region SR and between the channel region CR and the drain region DR by doping impurities with a lower concentration than that of the ion injection process. The low concentration doping region may serve as a buffer in the active pattern AP so that electrical characteristics of a thin film transistor may be improved.

Figure 15:
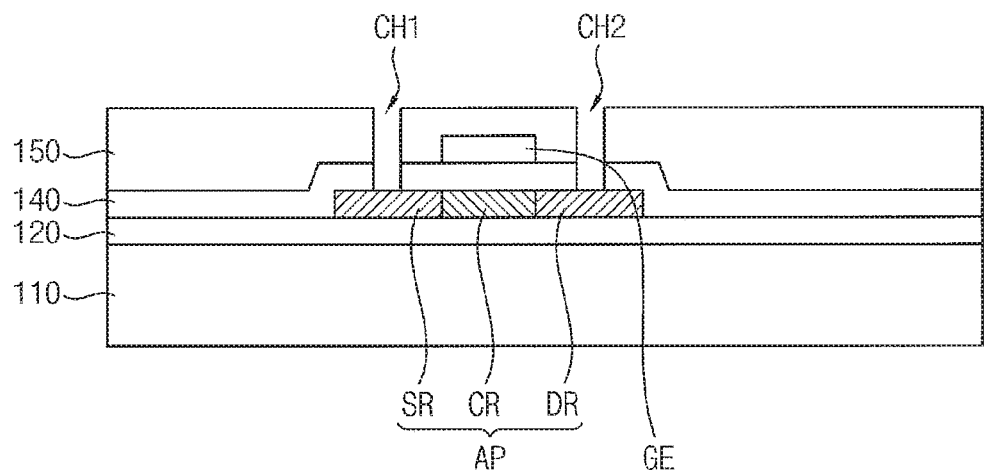

Referring to FIG. 15, an insulation interlayer 150 may be formed on the gate electrode GE. The insulation interlayer 150 may be disposed on the gate insulation layer 140, and may cover the gate electrode GE. The insulation interlayer 150 may include an inorganic insulation layer, an organic insulation layer, or a combination thereof. The insulation interlayer 150 may include silicon oxide, silicon nitride, silicon carbide, or a combination thereof. The insulation interlayer 150 may further include insulating metal oxide such as aluminum oxide, tantalum oxide, hafnium oxide, zirconium oxide, titanium oxide, etc. or a combination thereof. When the insulation interlayer 150 includes the organic insulation layer, the insulation interlayer 150 may include polyimide, polyamide, acryl resin, phenol resin, benzo cyclobutene (BCB), etc., or a combination thereof. The insulation interlayer 150 and the gate insulation layer 140 may be partially etched to form a first contact hole CH1 and a second contact hole CH2 respectively exposing the source region SR and the drain region DR.

Referring to FIG. 8, the source electrode SE and the drain electrode DE respectively electrically connected to the source region SR and the drain region DR of the active pattern AP may be formed on the insulation interlayer 150. A second metal layer may be formed on the insulation interlayer 150 and patterned to form the source electrode SE being in contact with the source region SR and the drain electrode DE being in contact with the drain region DR. Each of the source electrode SE and the drain electrode DE may include Au, Ag, Al, Cu, Ni, Pt, Mg, Cr, W, Mo, Ti, or an alloy thereof. Each of the source electrode SE and the drain electrode DE may have a single-layer structure or a multi-layer structure including different metal layers. Each of the source electrode SE and the drain electrode DE may include a triple layer of Mo, Al and Mo, a double layer of Cu and Ti, or the like.

A cleaning process using the hydrofluoric acid and a rinsing process using the hydrogenated deionized water may be performed before the crystallization process. The crystallization process in which the amorphous silicon layer is irradiated with the laser beam having a relatively large density with a relatively small scan pitch may be performed. The thin film transistor TR may be formed to include the active pattern AP having a relatively large grain size and a relatively small surface roughness. Because a grain size of the active pattern AP is relatively large, the number of grain boundaries per unit area may be small. Thus, an electric charge mobility of the thin film transistor TR including the active pattern AP may increase. Because the surface roughness of the active pattern AP is relatively small, an interface area between the active pattern AP and the gate insulation layer 140 located on the active pattern AP may be small. Thus, hysteresis characteristic of the thin film transistor TR including the active pattern AP may be improved, and the gate insulation layer 140 having a relatively small thickness may be formed on the active pattern AP.

Table 1 below illustrates that an electric charge mobility and a threshold voltage deviation of a thin film transistor including an active pattern having a relatively small grain size and a relatively large surface roughness by being crystallized with a laser beam having a relatively small energy density according to a comparative example of the prior art, and an electric charge mobility and a threshold voltage deviation of the thin film transistor TR including the active pattern AP having a relatively large grain size and a relatively small surface roughness by being crystallized with the laser beam having a relatively large energy density (e.g., about 480 mJ/cm$^2$) according to one or more examples of this disclosure. The threshold voltage deviation is a difference between a threshold voltage when luminance of a pixel changes from a high grayscale (e.g., a white grayscale) to a low grayscale (e.g., a black grayscale) and a threshold voltage when luminance of the pixel changes from the low grayscale to the high grayscale, and hysteresis characteristic of the thin film transistor may be decreased as the threshold voltage deviation is larger.

TABLE 1

| | Comparative example | Example |
|---|---|---|
| Electric charge mobility [cm$^2$/V · s] | 89.85 | 92 |
| Threshold voltage deviation [V] | 0.2662 | 0.1874 |

Referring to Table 1, the electric charge mobility of the thin film transistor according to the comparative example is less than 90 cm$^2$/V·s. In contrast, the electric charge mobility of the thin film transistor TR according to an embodiment of the invention may be greater than about 90 cm$^2$/V·s. Further, the threshold voltage deviation of the thin film transistor according to the comparative example is greater than 0.22 V. In contrast, the threshold voltage deviation of the thin film transistor TR according to an embodiment of the invention may be less than about 0.2 V. Therefore, the thin film transistor substrate 100 according to an embodiment of the invention may include the thin film transistor TR having a relatively large electric charge mobility and improved hysteresis characteristic.

Figure 16:
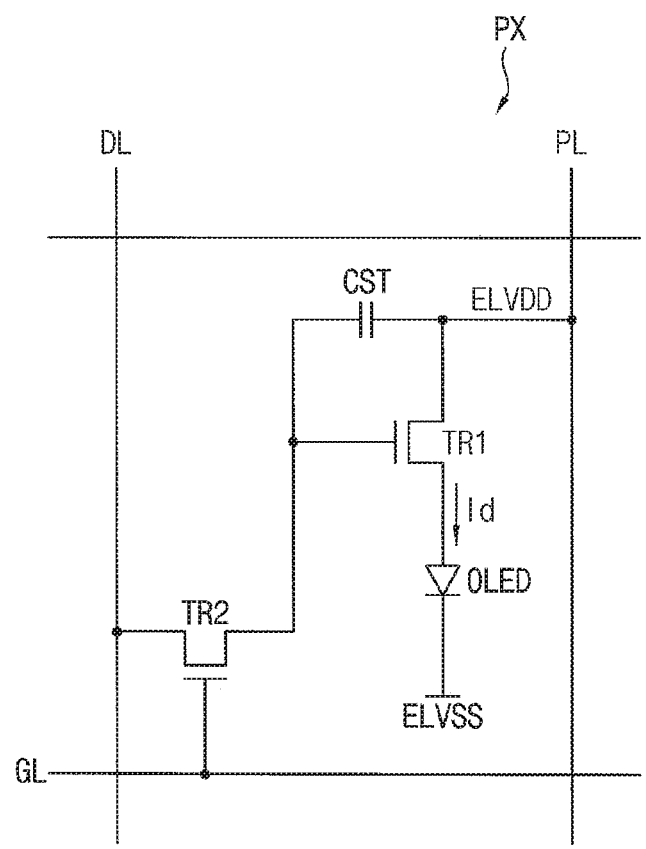
FIG. 16 is a schematic diagram of an equivalent circuit of a pixel of a display device according to an embodiment.

Hereinafter, a display device and a method of manufacturing the display device will be described with reference to FIGS. 16 to 19. FIG. 16 is a schematic diagram illustrating an equivalent circuit of a pixel of a display device according to one or more examples. A display device according to an embodiment may include signal lines and pixels PX connected to the signal lines and arranged as a substantial matrix form.

The signal lines may include gate lines GL for transmitting gate signals (or scan signals), data lines DL for transmitting data voltages, and driving voltage lines PL for transmitting driving voltages ELVDD. The gate lines GL may extend along a substantial row direction. The data lines DL and the driving voltage lines PL may cross the gate lines GL, and may extend along a substantial column direction. Referring to FIG. 16, each pixel PX may include a driving transistor TR1, a switching transistor TR2, a storage capacitor CST, and an organic light emitting diode OLED.

The driving transistor TR1 may include a control terminal connected to the switching transistor TR2, an input terminal connected to the driving voltage line PL, and an output terminal connected to the organic light emitting diode OLED. The driving transistor TR1 may transmit an output current Id whose magnitude varies depending on the voltage between the control terminal and the output terminal of the driving transistor TR1 to the organic light emitting diode OLED.

The switching transistor TR2 may include a control terminal connected to the gate line GL, an input terminal connected to the data line DL, and an output terminal connected to the driving transistor TR1. The switching transistor TR2 may transmit a data voltage applied to the data line DL in response to a gate signal applied to the gate line GL to the driving transistor TR1.

The storage capacitor CST may connect the control terminal and the input terminal of the driving transistor TR1. The storage capacitor CST may store the data voltage applied to the control terminal of the driving transistor TR1, and may maintain the data voltage after the switching transistor TR2 is turned off.

The organic light emitting diode OLED may include an anode connected to the output terminal of the driving transistor TR1 and a cathode connected to a common voltage ELVSS. The organic light emitting diode OLED may emit light having different luminance depending on the output current Id of the driving transistor TR1 thereby displaying an image.

In an embodiment, each pixel PX may include two thin film transistors TR1 and TR2 and one capacitor CST, however, the number of transistors and/or capacitor(s) and their configuration are not limited thereto. In other embodiments, each pixel PX may include three or more thin film transistors and two or more capacitors.

Figure 17:
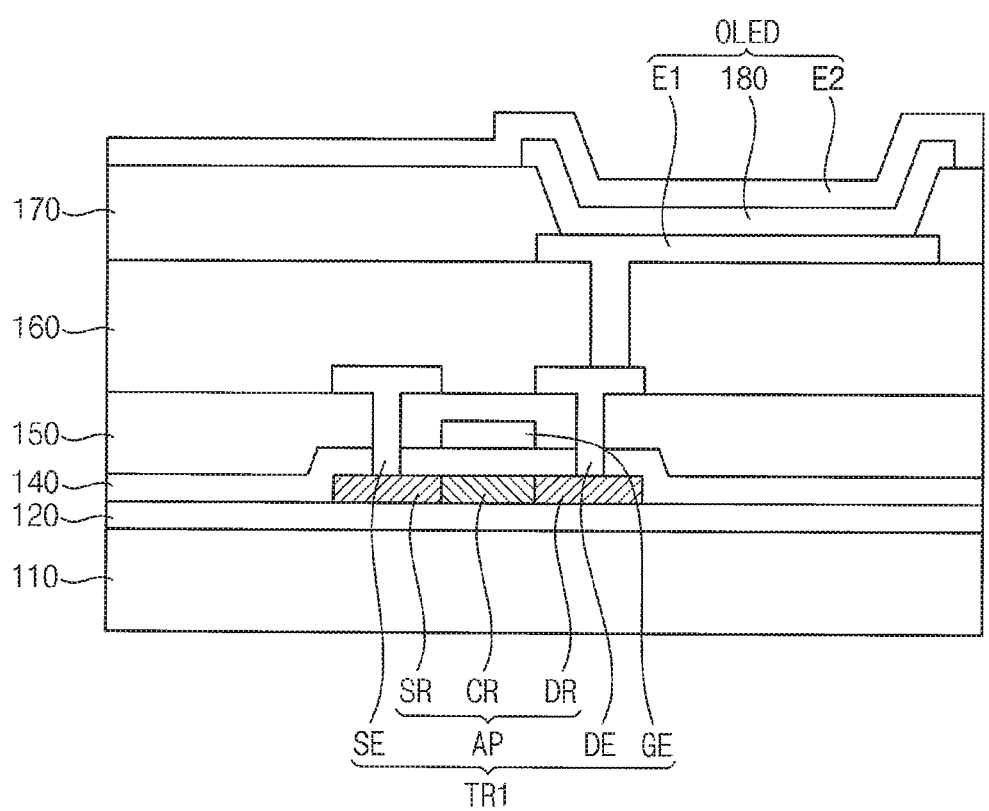
FIG. 17 is a schematic cross-sectional view illustrating a display device according to an embodiment.

FIG. 17 is a schematic cross-sectional view illustrating a display device according to an embodiment.

Referring to FIG. 17, a display device may include a substrate 110, a thin film transistor TR1 disposed on the substrate 110, and a display element disposed on the thin film transistor. The display device may include an organic light emitting diode as the display element. However, in other embodiments, the display device may include, as a display element, a liquid crystal element, an electrophoresis element, an electrowetting element, etc.

The thin film transistor TR1 and the organic light emitting diode OLED shown in FIG. 17 may correspond to the driving transistor TR1 and the organic light emitting diode OLED shown in FIG. 16, respectively. The display device may include the thin film transistor substrate 100 as illustrated in FIG. 8.

The organic light emitting diode OLED may include a first electrode E1, an emission layer 180, and a second electrode E2, which are sequentially stacked. The organic light emitting diode OLED may emit light based on a driving current receiving from the thin film transistor TR1 to display an image.

Figure 18:
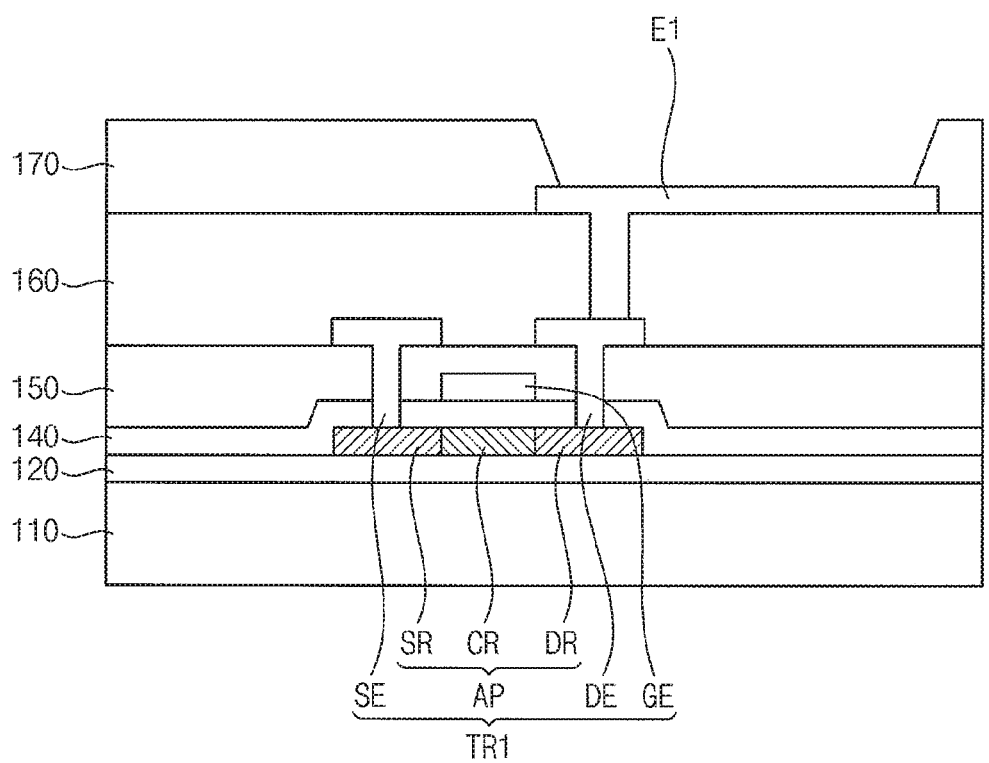
FIGS. 18 and 19 are schematic cross-sectional views to explain a method of manufacturing a display device according to an embodiment.
Figure 19:
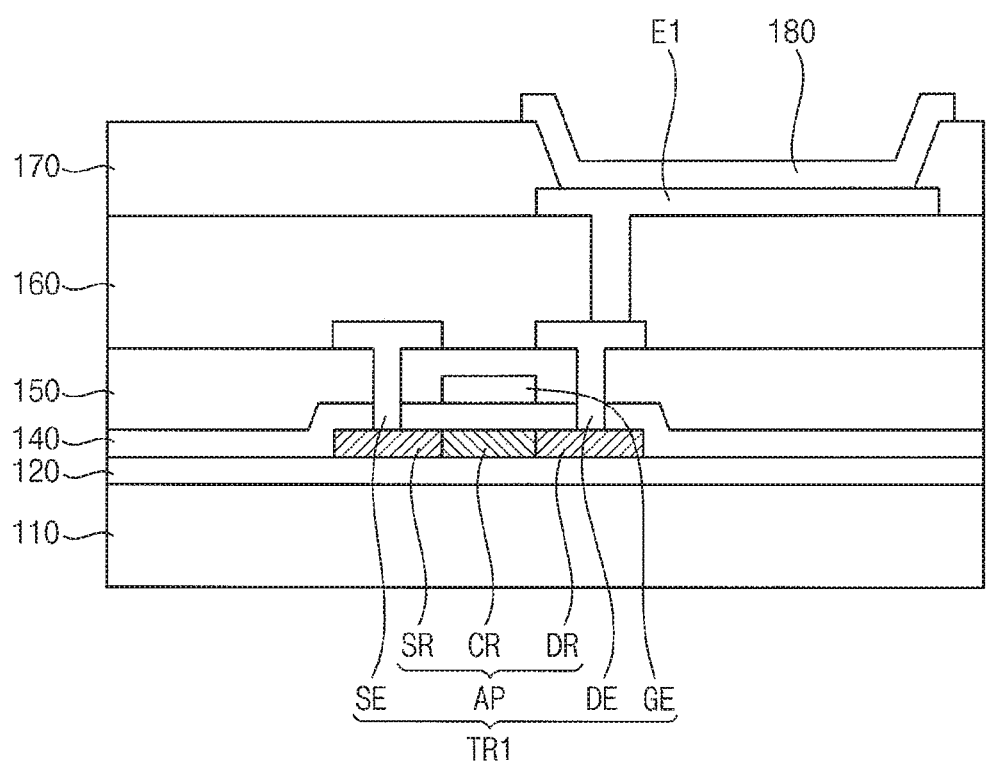

FIGS. 18 and 19 are schematic cross-sectional views to explain a method of manufacturing a display device according to an embodiment, for example, the display device shown in FIG. 17. In the below description of a method of manufacturing a display device, it will be avoided to repeat the same or similar description provided above for the method of manufacturing the thin film transistor substrate.

Referring to FIG. 18, a first electrode E1 may be formed on a thin film transistor TR1. A planarization layer (or a passivation layer) 160 may be formed on a source electrode SE and a drain electrode DE. The planarization layer 160 may be disposed on an insulation interlayer 150, and may cover the source electrode SE and the drain electrode DE. The planarization layer 160 may protect the thin film transistor TR1. The planarization layer 160 may provide a planarized surface above the thin film transistor TR1.

The planarization layer 160 may include an inorganic insulation layer, an organic insulation layer, or a combination thereof. In varying examples, the planarization layer 160 may have a single-layer structure or a multi-layer structure including silicon nitride or silicon oxide. In case that the planarization layer 160 includes the organic insulation layer, the planarization layer 160 may include polyimide, polyamide, acrylic resin, phenol resin, BCB, etc. or a combination thereof.

The planarization layer 160 may be patterned to form a contact hole that exposes the drain electrode DE. The first electrode E1 may be formed on the planarization layer 160. The first electrode E1 may be connected to the drain electrode DE. A third metal layer may be formed on the planarization layer 160 and patterned to form the first electrode E1 that is in contact with the drain electrode DE.

The first electrode E1 may be a pixel electrode of the display device. The first electrode E1 may be formed as a transmitting electrode or a reflective electrode depending on an emission type of the display device. When the first electrode E1 is formed as the transmitting electrode, the first electrode E1 may include indium tin oxide (ITO), indium zinc oxide (IZO), zinc tin oxide (ZTO), indium oxide ($In_2O_3$), zinc oxide (ZnO), tin oxide ($SnO_2$), etc., or a combination thereof. In case that the first electrode E1 is formed as the reflective electrode, the first electrode E1 may include Au, Ag, Al, Cu, Ni, Pt, Mg, Cr, W, Mo, Ti, etc., or a combination thereof. The first electrode E1 may have a multi-layer structure including the materials used in the transmitting electrode.

A pixel defining layer 170 may be formed on the planarization layer 160. The pixel defining layer 170 may have an opening portion that exposes at least a portion of the first electrode E1. The pixel defining layer 170 may include an organic insulation material.

Referring to FIG. 19, an emission layer 180 may be formed on the first electrode E1. The emission layer 180 may be formed on an upper surface of the first electrode E1 exposed by the opening portion of the pixel defining layer 170. The emission layer 180 may be formed by methods such as screen printing, inkjet printing, evaporation, etc.

The emission layer 180 may include a low molecular weight polymer or a high molecular weight polymer. The emission layer 180 may include copper phthalocyanine, N,N'-diphenylbenzidine, tris-(8-gydroxyquinoline)aluminum, etc., or a combination thereof as the low molecular weight polymer. The emission layer 180 may include poly (3,4-ethylenedioxythiophene), polyaniline, poly-phenylenevinylene, polyfluorene, etc., or a combination thereof as the high molecular weight polymer. The emission layer 180 may emit red light, green light, or blue light. In other embodiments, the emission layer 180 may emit white light. In that case, the emission layer 180 may have a multi-layer structure including a red emission layer, a green emission layer, and a blue emission layer, or a single-layer structure including a red emission material, a green emission material, and a blue emission material. A hole injection layer and/or a hole transport layer may be further formed between the first electrode E1 and the emission layer 180, or an electron transport layer and/or an electron injection layer may be further formed on the emission layer 180.

Referring to FIG. 17, a second electrode E2 may be formed on the emission layer 180. The second electrode E2 may be a common electrode of the display device. The second electrode E2 may be formed as a transmitting electrode or a reflective electrode depending on an emission type of the display device. In case that the second electrode E2 is formed as the transmitting electrode, the second electrode E2 may include lithium (Li), calcium (Ca), lithium fluoride (LiF), aluminum (Al), magnesium (Mg), or a combination thereof.

The display device may be a top emission type in which light is emitted toward the second electrode E2. However, the emission type is not limited thereto. The display device may also be a bottom emission type.

The display devices according to the disclosed examples may be applied to a display device included in a computer, a notebook, a mobile phone, a smartphone, a smart pad, a PMP, a PDA, an MP3 player, or the like.

Although the methods of manufacturing the polycrystalline silicon layers, the thin film transistor substrates and the methods of manufacturing the same, and the display devices and the methods of manufacturing the same according to the examples have been described with reference to the drawings, the illustrated examples may be modified and changed by a person having ordinary knowledge in the relevant technical field without departing from the technical spirit described in the following claims.

What is claimed is:

1. A display device, comprising:
   a substrate;
   a thin film transistor disposed on the substrate; and
   a display element electrically connected to the thin film transistor,
   wherein the thin film transistor comprises:
      an active pattern disposed on the substrate, the active pattern including polycrystalline silicon;
      an insulation layer disposed on the active pattern; and
      a gate electrode disposed on the insulation layer, wherein
      the active pattern comprises grains, and an average size of the grains is in a range of about 400 nm to about 800 nm, and
      the active pattern comprises a rough surface of which roughness has a root-mean-square value equal to or less than about 4 nm.

2. A display device, comprising:
   a substrate;
   a thin film transistor disposed on the substrate; and
   a display element electrically connected to the thin film transistor,
   wherein the thin film transistor comprises:
      an active pattern disposed on the substrate, the active pattern including polycrystalline silicon;
      an insulation layer disposed on the active pattern; and
      a gate electrode disposed on the insulation layer, wherein
   the active pattern comprises grains, and an average size of the grains is in a range of about 400 nm to about 800 nm, and
   the active pattern comprises a surface on which a protrusion is formed between adjacent ones of the grains, and a thickness of the protrusion is about 4 nm or less.

3. The display device of claim 2, wherein the thickness of the protrusion corresponds to a distance between a top of the protrusion and a surface of the active pattern in a grain adjacent to the protrusion.

4. The display device of claim 1, wherein the active pattern comprises grain boundaries each of which is formed between adjacent ones of the grains, and a size of a grain corresponds to a distance between adjacent grain boundaries of the grain.

5. The display device of claim 1, wherein each grain includes one or more crystal planes, and a ratio of a (111) direction crystal plane to total crystal planes of the active pattern is greater than a ratio of a (001) direction crystal plane to the total crystal planes.

6. The display device of claim 1, wherein a value obtained by dividing a sum of a ratio of a (001) direction crystal plane to total crystal planes of the active pattern and a ratio of a (101) direction crystal plane to the total crystal planes by a ratio of a (111) direction crystal plane to the total crystal planes is about 0.7 or less.

7. The display device of claim 1, wherein the display element comprises:
- a first electrode electrically connected to the thin film transistor;
- an emission layer disposed on the first electrode; and
- a second electrode disposed on the emission layer.

* * * * *